(12) United States Patent
Jamar et al.

(10) Patent No.: US 10,114,289 B2
(45) Date of Patent: Oct. 30, 2018

(54) EXPOSURE HEAD, EXPOSURE APPARATUS AND METHOD OF OPERATING AN EXPOSURE HEAD

(71) Applicant: Nederlandse Organisatie voor toegepast-natuurwetenschappelijk onderzoek TNO, 's-Gravenhage (NL)

(72) Inventors: Jacobus Hubertus Theodoor Jamar, 's-Gravenhage (NL); Herman Hendrikus Maalderink, 's-Gravenhage (NL); Erwin Rinaldo Meinders, 's-Gravenhage (NL); Peter Theodorus Maria Giesen, 's-Gravenhage (NL); Erwin John van Zwet, 's-Gravenhage (NL); Henri Jacques Antoine Jean Starmans, 's-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 0 days.

(21) Appl. No.: 15/304,300

(22) PCT Filed: Apr. 14, 2015

(86) PCT No.: PCT/NL2015/050249
§ 371 (c)(1),
(2) Date: Oct. 14, 2016

(87) PCT Pub. No.: WO2015/160252
PCT Pub. Date: Oct. 22, 2015

(65) Prior Publication Data
US 2017/0038690 A1   Feb. 9, 2017

(30) Foreign Application Priority Data

Apr. 15, 2014  (EP) .................................. 14164746

(51) Int. Cl.
*G03B 27/54* (2006.01)
*G03F 7/20* (2006.01)
(Continued)

(52) U.S. Cl.
CPC ....... *G03F 7/2051* (2013.01); *G02B 26/0875* (2013.01); *G02B 26/12* (2013.01); *G03F 7/704* (2013.01); *G03F 7/70391* (2013.01)

(58) Field of Classification Search
CPC ............ G03F 7/72051; G02B 26/0875; G02B 7/70391
(Continued)

(56) References Cited

U.S. PATENT DOCUMENTS

| 3,253,498 A | 5/1966 | Lindberg et al. |
| 4,000,493 A | 12/1976 | Spaulding et al. |
| 5,990,983 A | 11/1999 | Hargis et al. |
| 2003/0184834 A1* | 10/2003 | Inagaki ................ G02B 26/126 359/205.1 |

(Continued)

FOREIGN PATENT DOCUMENTS

| DE | 2116469 A1 | 10/1972 |
| DE | 102004053659 B3 | 4/2006 |

(Continued)

*Primary Examiner* — Hung Henry Nguyen
(74) *Attorney, Agent, or Firm* — Hoffmann & Baron, LLP

(57) ABSTRACT

The invention is directed at an exposure head for use in an exposure apparatus for illuminating a surface, the exposure head comprising one or more radiative sources for providing one or more beams, an optical scanning unit arranged for receiving the one or more beams and for directing the beams towards the surface for impinging each of the beams on an impingement spot, a rotation actuating unit connected to the optical scanning unit for at least partially rotating the optical scanning unit, wherein the impingement spots of the one or more beams are scanned across the surface by said at least partial rotation of the optical scanning unit, wherein the optical scanning unit comprises a transmissive element (Continued)

including one or more facets for receiving the one or more beams and for outputting the beams after conveying thereof through the transmissive element, for displacing the beams upon said rotation of the transmissive element for enabling the scanning of the impingement spots.

20 Claims, 7 Drawing Sheets

(51) Int. Cl.
  *G02B 26/08* (2006.01)
  *G02B 26/12* (2006.01)

(58) Field of Classification Search
  USPC .............................................. 355/52, 53, 67
  See application file for complete search history.

(56) References Cited

U.S. PATENT DOCUMENTS

| 2007/0171366 | A1 | 7/2007 | Su et al. |
| 2007/0279609 | A1 | 12/2007 | Oshida et al. |
| 2008/0084594 | A1* | 4/2008 | Masuda ............... G02B 26/125 359/205.1 |
| 2009/0268266 | A1* | 10/2009 | Kudo .................. G02B 26/125 358/475 |
| 2010/0277702 | A1 | 11/2010 | Gollier |

FOREIGN PATENT DOCUMENTS

| EP | 059676 A1 | 5/1994 |
| EP | 1424598 A1 | 2/2004 |
| WO | 2008010708 A1 | 1/2008 |
| WO | 2008071347 A2 | 6/2008 |
| WO | 2009084957 A1 | 7/2009 |

* cited by examiner

EXPOSURE HEAD, EXPOSURE APPARATUS AND METHOD OF OPERATING AN EXPOSURE HEAD

This application is the U.S. National Phase of, and Applicants claim priority from, International Patent Application Number PCT/NL2015/050249 filed 14 Apr. 2015, which claims priority from EP 14164746.1 filed 15 Apr. 2014, each of which is incorporated herein by reference.

FIELD OF THE INVENTION

The present invention is directed at an exposure head for use in an exposure apparatus for illuminating a surface, the exposure head comprising one or more radiative sources for providing one or more beams, an optical scanning unit arranged for receiving the one or more beams and for directing the beams towards the surface for impinging each of the beams on an impingement spot. The invention is further directed at an exposure apparatus and a method of operating an exposure head for illuminating a plane surface.

BACKGROUND

Conventional maskless exposure systems often use a single laser and scanning optics to deflect the beam towards different positions on the substrate. There are some important side effects of the deflection that usually occur, and that are not always addressed in the different systems. For example, these effects include oblique beam landing which causes position errors on imperfectly flat substrates. In a lithographic system, this may well result in defects in the end product. Other undesired side effects that may lead to such defects are spot growth due to oblique landing of the beam on the substrate and defocusing of spots.

The deflection can for example be done with a double galvanometer mirror. An F-theta objective is then needed to achieve correct focus on all substrate positions. The other two side effects are not corrected this way. Another method is to use a rotating polygon mirror. Again, optics after the scanner are needed, at least to compensate for the defocusing. The optics may as well correct for the oblique landing such that all beams land perpendicularly on the substrate. However, a relatively complex optical system for this is required.

The systems all suffer from a limitation in achievable spot size. Due to the required long throw distance of the beam after deflection (to reach all the substrate area), the spot cannot be made very small (e.g. not smaller than 50 μm depending on factors like distance, wavelength, numerical aperture of optics). Short optical distances, and therefore smaller achievable spot size, may be obtained when using many light sources. This is because the substrate area to be served by each source becomes small. Some systems are known that apply this principle. However, as the above already suggests, many post scan lenses are needed to deal with the above side effects. These lenses can be small, but not very small: each lens needs to be at least the size of the scan length. This is substantially larger than the beam diameter, and substantially larger than the lenses in the optical path before the polygon. Therefore, the use of many laser beams only worsens the situation with respect to the post scan optics, making it more complex.

SUMMARY OF THE INVENTION

It is an object of the present invention to provide an exposure head wherein the abovementioned disadvantages are resolved, and which allows to expose a substrate accurately by illuminating the substrate with one or more beams in a scanning motion.

To this end, there is provided herewith an exposure head for use in an exposure apparatus for illuminating a plane surface, the exposure head comprising one or more radiative sources for providing one or more beams, an optical scanning unit arranged for receiving the one or more optical beams and for directing the beams towards the plane surface for impinging each of the beams on an impingement spot, a rotation actuating unit connected to the optical scanning unit for at least partially rotating the optical scanning unit, wherein the impingement spots of the one or more beams are scanned across the plane surface by said at least partial rotation of the optical scanning unit, wherein the optical scanning unit comprises a transmissive element including one or more facets for receiving the one or more laser beams and for outputting the beams after conveying thereof through the transmissive element, for displacing the beams upon said rotation of the transmissive element for enabling the scanning of the impingement spots. The radiative sources may be light sources for providing light beams.

The exposure head of the present invention makes use of Snell's law (also known as Snell-Descartes law or law of refraction) for enabling the one or more light beams of the exposure head to be scanned across the surface of the substrate. Snell's law defines the relation between the angle of incidence $\theta_1$ and the angle of refraction $\theta_2$ of the light beam relative to the normal at an interface surface, when the light beam travels from a first medium (e.g. air) into a second medium (e.g. glass) through the interface surface. According to Snell's law, the incident light beam reflects towards the normal vector of the interface surface when going from a medium having a smaller index of refraction $n_1$ to a medium having a larger index of refraction $n_2$. Inversely, when the light beam travels from a medium having a larger index of refraction $n_2$ towards a medium having a smaller index of refraction $n_1$, the light beam refracts at the interface surface to a direction more away from the normal vector. Mathematically, in terms of the angles of incidence $\theta_1$ and angle of refraction $\theta_2$ the relation between the angles is as follows:

$$\sin(\theta_1)/\sin(\theta_2) = n_2/n_1$$

In view of the above, the present invention uses a transmissive element wherein at least one facet of the element receives the one or more light beams, and wherein at least one other facet outputs the received one or more light beams after the light beams have traveled through the transmissive element. By rotating the transmissive element, the orientation of the receiving facet with respect to the incident one or more beams changes constantly. With reference to Snell's law above, the angles of the refracted light beams travelling internally within the transmissive element, relative to the normal vector of the interface surface provided by the facet, will change as a result of the rotation of the facet relative to the one or more beams. Inversely, at the facet forming the output of the transmissive element the indices of refraction of the two media at either side of the interface surface are reversed. Therefore, since the whole transmissive element rotates relative to the one or more light beams, the output angles of the light beams leaving the transmissive element relative to the normal vector to the interface surface change in opposite direction due to the rotation. Thus, by using a transmissive element in the path of the one or more light beams from the one or more light sources, and rotating the transmissive element at least partially around a (notional or physical) axis of rotation (such that the orientation of the receiving and outputting facets relative to the light beams changes due to the rotation), the direction of the light beams can be changed and the light beams can thereby be scanned across the surface of the substrate.

The one or more light sources may, in accordance with an embodiment, may be formed of or include one or more lased diodes (LD's). As will be appreciated, other light sources may be suitable as well. For example, the light sources may also or alternatively include one or more laser cavities. The light may be radiated directly without being guided, or may be transported towards the transmissive element via optics or one or more optical fibers.

Preferably, but not necessarily, the surface of the receiving facet that receives the one or more light beams is parallel to the surface of the outputting facet that outputs the one or more light beams. In that case, it can be seen that the change of direction of the incident light beams on the receiving facet is completely reversed at the output facet. Therefore, by using parallel surfaces of the receiving facet and outputting facet, for example a plan parallel plate, the direction of the light beams leaving the transmissive elements is exactly the same as the direction of the light beams incident on the transmissive elements and only their path has been displaced dependent on the orientation of the facet surfaces relative to the incident path of the light beams. This allows to scan the impingements spots of each of the light beams across the surface of the substrate without affecting the angle of incidence of the light beams on the substrate surface during scanning. The problem of oblique beam landings experienced with prior art methods that for example use mirrors, is thereby resolved without having to use correcting optics. This provides an elegant and simple solution for scanning the beams across the substrate surface. Moreover, as a result of the absence of a complex optics system, the distance between the light source (e.g. laser diode) and the substrate surface can be made much smaller than in the prior art methods. This has the further advantage that widening of the spot size of the impingement spot due to divergence across the travelling path can be reduced in proportion to the shortening of the optical path without further optics.

In accordance with a preferred embodiment of the present invention, the transmissive element is a polygon prism including the one or more facets. By using a polygon prism as the transmissive element, the prism can be made to rotate continuously at a constant rotational velocity to allow the scanning of the one or more light beams. By rotating the polygon prism such that a next facet of the polygon subsequently turns in front of the one or more light beams at a constant rate, the impingement spots of the light beams can be made to trace a same line section across the passing of each of the facets. Preferably, in accordance with a further embodiment, the facets of the polygon prism are even in number, wherein each two facets on opposing sides of the polygon prism cooperate such that in use a first one of said opposing facets receives at least one of said optical light beams and a second one of said opposing facets outputs said received at least one optical light beam. Even more preferably, the opposing facets are parallel such as to output the at least one optical light beam under a same angle as an angle of incidence of the at least one beam on the receiving first one of said opposing facets. The advantage of using opposing parallel facets wherein one of these facets forms the receiving facet and the other of the opposing facets forms the outputting facet (dependent on the orientation of the polygon prism relative to the light beams) has been explained above to allow scanning of the impingement spots across the surface of the substrate without changing the angle of incidence of the light beams on the substrate surface. The angle of incidence on the substrate surface can thus be kept constant, e.g. perpendicular to the surface.

As will be appreciated, the polygon prism may have any number of facets considered desirable by the skilled person. However, when using even numbers of facets wherein each facet has an opposing parallel facet, good results have been achieved with polygon prisms consisting of four, six, eight, ten, twelve, and fourteen facets. It is noted that using the larger number of facets causes each of the facets to become smaller (in relation to the size of the polygon prism). Because the size of the facets determines the maximum length of a line section that can be traced in a scanning motion by an impingement spot on the substrate surface, a fewer number of facets allows these line sections to be longer. Longer line sections are advantageous in most applications. If the number of facets becomes too small, undesired side effects may occur upon rotation of the polygon prism, such as total internal reflection at large angles of incidence (i.e. larger than the critical angle). An optimum between the number of facets and the length of the line sections scanned by the impingement spots on the substrate surface is for example found at a prism having 8 facets: an octagonal prism.

In accordance with a further embodiment, the head comprises a plurality of laser diodes. Moreover, the transmissive element may be of a size such as to enable receipt of a plurality of laser beams of the laser diodes by the transmissive element for simultaneous scanning thereof by the optical scanning unit. For example, using the example of an octagonal prism mentioned above, the prism could be octagonal in cross section, while having a length L such as to allows a total of N laser diodes in a row (e.g. arranged across the length L of the prism) to irradiate the prism. This allows the impingement spots of each of the N laser diodes to be scanned across the surface. In case the exposure head is translated relative to the substrate surface (e.g. in a straight line) while operating the laser diodes, a strip or band of the substrate surface may be scanned and illuminated using the exposure head.

According to a further embodiment two or more of a plurality of laser diodes are arranged adjacent each other in a direction perpendicular to a notional rotation axis of the at least partial rotation of the transmissive element by the rotation actuating unit. In other words, the laser diodes are arranged side by side relative to the transmissive element. By irradiating the transmissive element, each of the light beams is displaced by the transmissive element or polygon prism with an equal amount, such that the line sections traced by the impingement spots of the corresponding light beams are parallel and aligned with each other. In case the light from the two or more laser diodes describes exactly the same line section, the light yield at the surface of the substrate is correspondingly multiplied. Alternatively, light from the two or more light beams arranged adjacent each other as described above may be slightly angled such that the line sections traced by the impingement spots on the surface of the substrate are parallel to each other and aligned in each other's extension (or at least partially in each other's extension). For example, the laser beams of the two or more of the plurality of laser diodes arranged adjacently may be directed at substantially the same impingement location on the transmissive element.

Even more preferred, the line sections described by the impingement spots corresponding to each of the adjacent laser diodes mentioned above may be parallel, aligned, and complementary such as to obtain an extended line section, but such that the individual line sections at least partially overlap near each other's end points. By this overlap near the end points, minor errors in the exact placement or orientation of each individual LD may be corrected by means of suitable powering of the LD's during scanning. This has the advantage that exact placement of each of the individual LD's becomes less critical during manufacturing of the exposure head, because minor errors can be corrected within the driving software of the individual LD's controlling the powering of the LD's upon illumination of the substrate.

According to a further embodiment of the present invention the two or more adjacently arranged laser diodes mentioned above are placed such as to enable scanning of the laser beams across scan lines that are parallel but not aligned with each other, and wherein at least one of the placement of the adjacent laser diodes or the size of at least one of the facets of the transmissive element is such that the scan lines of the adjacent beams at least partially overlap for enabling exposure of an image at sub pixel accuracy by means of intensity manipulation of light from the laser beams. This embodiment is based on the assumption that the substrate surface, in order to be correctly exposed, must receive a certain threshold dose of light yield from the exposure head. Taking this threshold dose of light as an assumption, with the present embodiment the line sections of the impingement spots of the light beams of the adjacent laser diodes are parallel to each other and contiguous, such that there side sections partly overlap. By controlling the intensity of the light from the laser beams, it can be accurately controlled at sub pixel accuracy whether a sub pixel at the substrate surface receives the threshold dose or not. Therefore, this arrangement of laser beams relative to the transmissive element allows the illumination at sub pixel accuracy of the substrate surface.

According to a further embodiment of the present invention two or more of the plurality of laser diodes are arranged adjacent to each other in the direction parallel to a notional axis of the at least partial rotation of the transmissive element by the rotation actuating unit. Being placed parallel to the notional axis provides the embodiment mentioned hereinabove with the N laser diodes arranged across the length direction L of the polygon prism.

In accordance with a yet further embodiment of the present invention the plurality of laser diodes are arranged in rows and columns across a surface parallel with said notional axis of rotation of the at least partial rotation of the transmissive element by the rotation actuating unit, wherein an output face of each laser diode is shaped as a hexagon, and the laser diodes are arranged in a honeycomb arrangement. A honeycomb arrangement of LD's allows for a dense concentration of LD's across rows and columns, such as to achieve all of the advantages referred to above with respect to the placement of the laser diodes.

The exposure head according to a further embodiment of the present invention further comprises an exposure control unit arranged for receiving exposure data and for controlling operation of the one and more laser diodes dependent on the exposure data. For example, the control unit may receive a data signal and may power each of the individual laser diodes of the exposure head suitably corresponding to the received data signal. This for example may include correction of the operation of the laser diodes such as to correct for incorrect placement or minor construction errors referred to above, or suitable control of operation of individual laser diodes such as to obtain exposure head sub pixel accuracy as referred to above. The control unit may receive the respective data signals from an image controller of an exposure apparatus wherein the exposure head is installed.

The exposure head may in use be moved relative to the illuminated surface in a motion direction, the illuminated surface being a substrate surface. Two or more of said plurality of laser diodes are arranged adjacent each other in the motion direction such as to enable illumination of the surface simultaneously in a same path in said motion direction. Also, the illumination patterns of adjacent diodes in subsequent passing of facets of the polygon prism or transmissive element may be made to overlap, e.g. by controlling the velocity of the relative motion between the exposure head and the substrate surface. In yet accordance with another embodiment, the exposure head may in use be moved relative to the illuminated surface in a motion direction, the illuminated surface being a substrate surface, wherein two or more of said plurality of laser diodes are arranged adjacent each other under an angle with the motion direction, such as to illuminate the substrate surface simultaneously in overlapping or parallel paths in said motion direction.

In accordance with a further aspect of the present invention, there is provided an exposure apparatus comprising an exposure head as described hereinabove. In a preferred embodiment, the exposure head according to this aspect further comprises a motion driver for moving the at least one exposure head across an exposure trajectory over a substrate surface for exposing the substrate surface, further comprising an image controller arranged for providing an electric signal to the at least one exposure head dependent on exposure image data, for enabling control of the laser diodes of the at least one exposure head. The motion driver allows the exposure head to describe a strip or band across the substrate surface. The image controller allows to provide electric signals to the control unit of the at least one exposure head dependent on exposure image data. The exposure image data may for example be obtained from a data repository such as a memory, or from a network or other data communication means. The motion driver of the exposure apparatus may be arranged for adapting the motion velocity of the exposure head such that in time subsequent illumination patterns of said two or more adjacent laser diodes at least partially overlap.

In accordance with a further embodiment of the exposure apparatus, one or more of the at least one exposure head apparatus comprises at least two laser diodes which are arranged adjacent each other in a direction perpendicular to a notional rotation axis of the at least partial rotation of the transmissive element by the rotation actuating unit of said exposure head, wherein the at least two adjacently arranged laser diodes are placed such as enable scanning of the laser beams across scan lines that are aligned with each other, and wherein at least one of the placement of the adjacent laser diodes or the size of at least one of the facets of the transmissive element of the exposure head is such that the scan lines of the adjacent laser beams at least partly overlap, wherein at least one of the image controller of the apparatus or an exposure control unit of the exposure head is arranged for timing operation of the laser diodes dependent on the exposure image data.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

DETAILED DESCRIPTION

Figure 1:
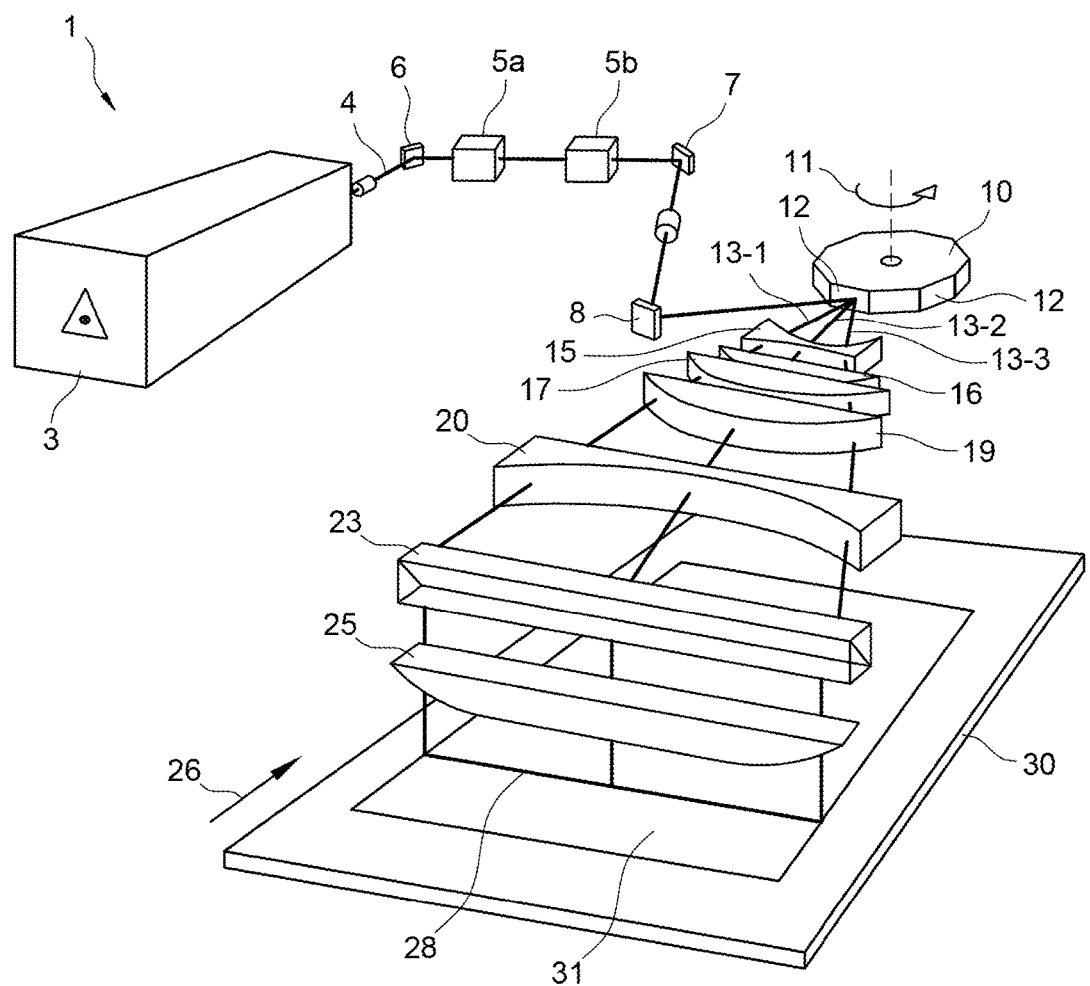
FIG. 1 schematically illustrates the principle of an exposure system in accordance with the prior art.

The working principle of a conventional exposure head 1, based on a rotating polygon mirror 10, is schematically illustrated in FIG. 1. The exposure head 1 comprises a light source 3. The light source 3 is a single laser providing a laser beam 4 which is shaped, and changed in direction continuously such as to trace a line section 28 on the surface 31 on the substrate 30. By moving the substrate as indicated by arrow 26, an area of the surface 31 can be scanned and illuminated with the laser beam. Modulators 5a and 5d along the path of the beam 4 allow for modulation of the intensity of the beam, such as to turn the beam on and off during scanning and to enable illuminating a predefined illumination pattern on the surface 31 of the substrate 30. Using mirrors 6, 7 and 8, the beam 4 is led towards polygon mirror 10. Polygon mirror 10 rotates around an axis 11. The beam 4 thereby falls on to the facets of the polygon mirror 10 that are passing by.

As a result of the rotation 11, the facets 12 while passing by continuously change orientation with respect to the beam 4. Thereby, the beam 4 is constantly changing direction dependent on the momentary position of the facet 12 on which the beam 4 is incident. Downstream of the polygon mirror 10, the laser beam in different positions is indicated with reference numerals 13-1, 13-2 and 13-3. In view of the direction of rotation, the beam first describes the path 13-1 as soon as it is incident on the facet 12 for the first time. While facet 12 rotates further, the beam describes path 13-2 and at the ultimate point of incidence (just before the laser beam 4 will be incident on the next facet), the beam will describe path 13-3. As indicated in FIG. 1, the beam (13-1 through 13-3) is deflected onto the substrate surface 31 using mirror 23.

In the absence of post scan optics 15, 16, 17, 19, 20 and 25 undesired effects would occur. As shown in FIG. 1, the beam reflected by mirror 10 will slightly change direction during rotation of the mirror. In other words, the beam path of the outgoing beam changes while the orientation of the facets 12 changes by rotation of the mirror 10. This is indicated by the momentary beam paths 13-1 through 13-3, which are mutually oblique for different orientations of the facets 12. The undesired optical effects caused by this is resolved by post scan optics 15, 16, 17, 19, 20 and 25.

For a system having obliquely diverging output beams, the focus would be on a curved surface. On a flat surface defocusing will occur. Moreover, the deflected beam land obliquely (except in one point on the surface), and the spot from an obliquely landing beam will be elongated (not shown; imagine the beam as a cylinder and the spot as an oblique cross section through the cylinder). To resolve these undesired effects, a complex system of post scan optics is applied. First step is correction of defocusing. This can be done with one or a few lens elements. This correction typically has the side effect of increasing the deflected spot (one can view this as the consequence of a larger optical magnification of the source spot towards the deflected positions). Next step(s), is (are) to correct the oblique landing and/or spot magnification towards deflected positions and/or non-uniform scan velocity, requiring more complicated optics, as in FIG. 1. In FIG. 1, these optics include lenses 15, 16, 17, 19, 20 and 25, including mirror 23. The optics 15-19 and 25 account for a number of aberrations. However, it is challenging to completely resolve the effects using these optics, for example as a result of the constantly changing angle of incidence of the beam.

FIGS. 2A-2D schematically illustrate the working principle of an exposure head including a transmissive element in accordance with the present invention. The exposure head 33 comprises a transmissive element 40. The transmissive element 40 may be made of any suitable material which is transparent to the light of the laser diodes used for illumination. For example, in many applications a suitably chosen type of glass or a transparent polymer will provide an excellent material for enabling displacement of the beam upon rotation of the transparent element 40. In some embodiments, the maximum displacement at ultimate ends of the facet (upon rotation of the transmissive element 40) may be desired to be as large as possible. The internal angle of the refracted beam relative to the normal at the interface surface of the transparent element 40 may in those cases be as small as possible to achieve this. If internally within the transmissive element 40 the angle of the beam relative to the normal at the interface surface is minimized, displacement of the beam at the output side is correspondingly maximized. As will be explained further below in relation to FIG. 3, this may be achieved by selecting a material having a large index of refraction in comparison to air. Another requirement that may be considered for selecting a suitable material is that the material itself should be as transparent as possible to the wavelength of the light coming from the laser diodes, such as to prevent the transmissive element 40 from acting as a filter.

Roughly for wavelengths between 400 nm and 1700 nm, some material that that are sufficiently transparent include any of the glass types of a group comprising: Borofloat™, Pyrex 7740®, N-BK7, N-K5, B270, N-BaF10, N-SFS, N-SF10, N-SF11, N-LaSFN9. These glass types mentioned are made available by SCHOTT AG of Germany (Hattenbergstrasse 10, 55122 Mainz), but of course similar or different glass types of other manufacturers, or even other optical materials, may be applied. The list provided above is merely presented as an indication such as to provide a complete disclosure, and must not be interpreted as a limitation. Below 400 nm and above 1700 nm, some of the listed glass types become less transmissive (at different wavelength ranges), and care must be taken during the selection of the desired material that optical losses are within desired limits.

Figure 2A:
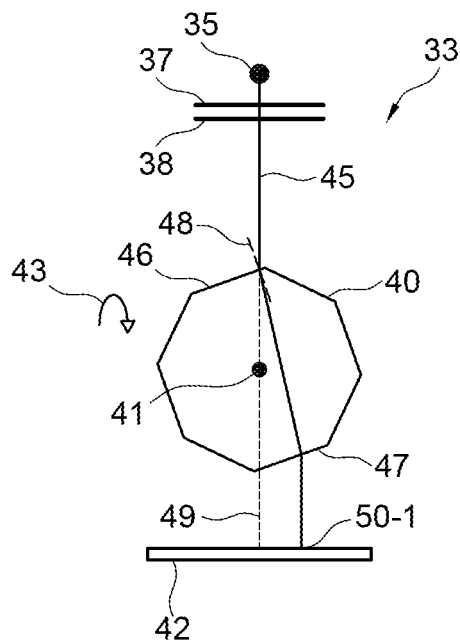
FIGS. 2A-2D schematically illustrate the working principle of an exposure head in accordance with the present invention.

Back to FIGS. 2A-2D, the transmissive element 40 is a polygon prism having an octagonal cross section. The octagonal polygon prism 40 rotates around an axis of rotation 41 in a direction indicated by arrow 43. A laser diode 35 provides a laser beam 45 of monochromatic light which is to be scanned by tracing a pattern on a surface of substrate 42. Some optics indicated by lenses 37 and 38 may be present in the optical path prior to the octagonal polygon prism 40 such as to shape the beam (e.g. to get rid of diversions). Moreover, and not shown in FIGS. 2A-2D, operation of the laser diode 35 may be controlled such as to switch the laser beam 45 on and of in accordance with a desired pattern corresponding to the image to be illuminated on the surface of substrate 42. In FIG. 2A, the laser beam 45 is incident on facet 46 of polygon prism 40. The normal to the surface of facet 46 is indicated by dotted line 48. The index of refraction of the polygon prism 40 differs from the index of refraction of the ambient air. Therefore, upon impingement of the beam 45 onto the surface of facet 46, the beam 45 will refract in a direction closer to the normal 48 while travelling through the polygon prism 40. At the other end of the polygon prism 40, at facet 47, the beam 45 leaves the polygon prism 40. Travelling from the material of the polygon prims 40, which has a higher index of refraction, into the ambient air, the beam 45 is refracted back to its original direction; i.e. the direction of beam 45 prior to entering the polygon prism 40. In the position indicated in FIG. 2A, the beam 45 impinges on the surface of substrate 42 in impingement spot 50-1. The direction that the beam 45 would have traveled in case polygon prism 40 would not have been present is indicated by dotted line 49. Dotted line 49 has been illustrated as a reference in FIGS. 2A-2D such as to clearly visualize the scanning of the impingement spot (50-1 through 50-4) across the surface of the substrate 42 caused by rotation of polygon prism 40.

Figure 2B:
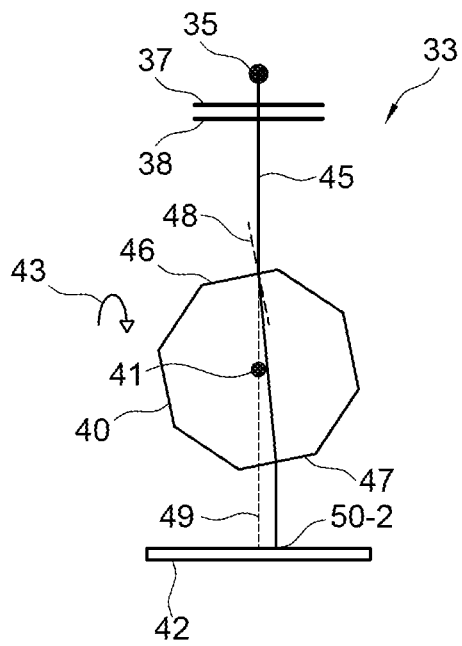
Figure 2C:
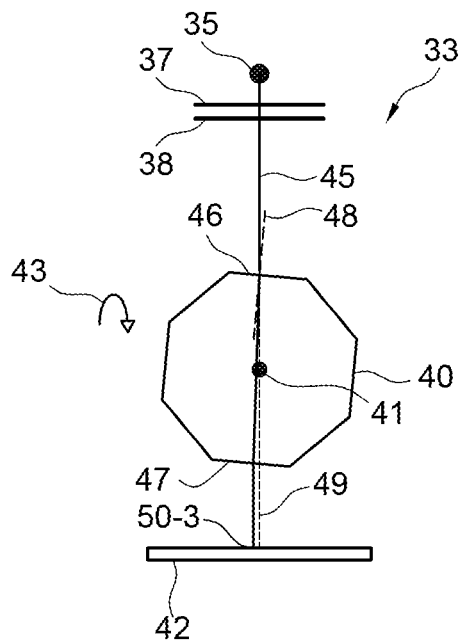
Figure 2D:
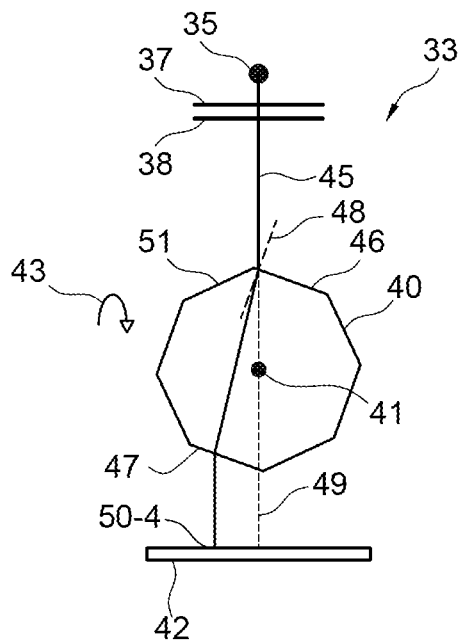

In FIG. 2B, the same situation as in FIG. 2A is illustrated but with the polygon prism 40 being rotated slightly in the direction indicated by arrow 43, in comparison with FIG. 2A. Clearly, impingement spot 50-2 has been moved more to the left on the substrate surface 42 in comparison to impingement spot 50-1. This is because the amount of displacement of the beam 45 is changed due to the changed orientation of polygon prism 40 relative to the beam 45. Similarly, in FIG. 2C, the impingement spot 50-3 has been moved further to the left, and now impinges on the surface of the substrate 42 to the left of reference line 49. Next, in FIG. 2D, the beam 45 impinges on facet 46 on the ultimate left side thereof due to the changed orientation of polygon prism 40. Likewise, impingement spot 50-4 on surface of substrate 42 has reached its ultimate point on the line section described by the impingement spot. When polygon prism 40 is rotated further in accordance with the direction indicated by arrow 43, beam 45 will impinge on the ultimate right side of facet 51 and basically the same situation will be obtained as indicated in FIG. 2A. Therefore, the beam 45 will then impinge on the surface of substrate 42 in impingement spot 50-1 again.

Figure 3:
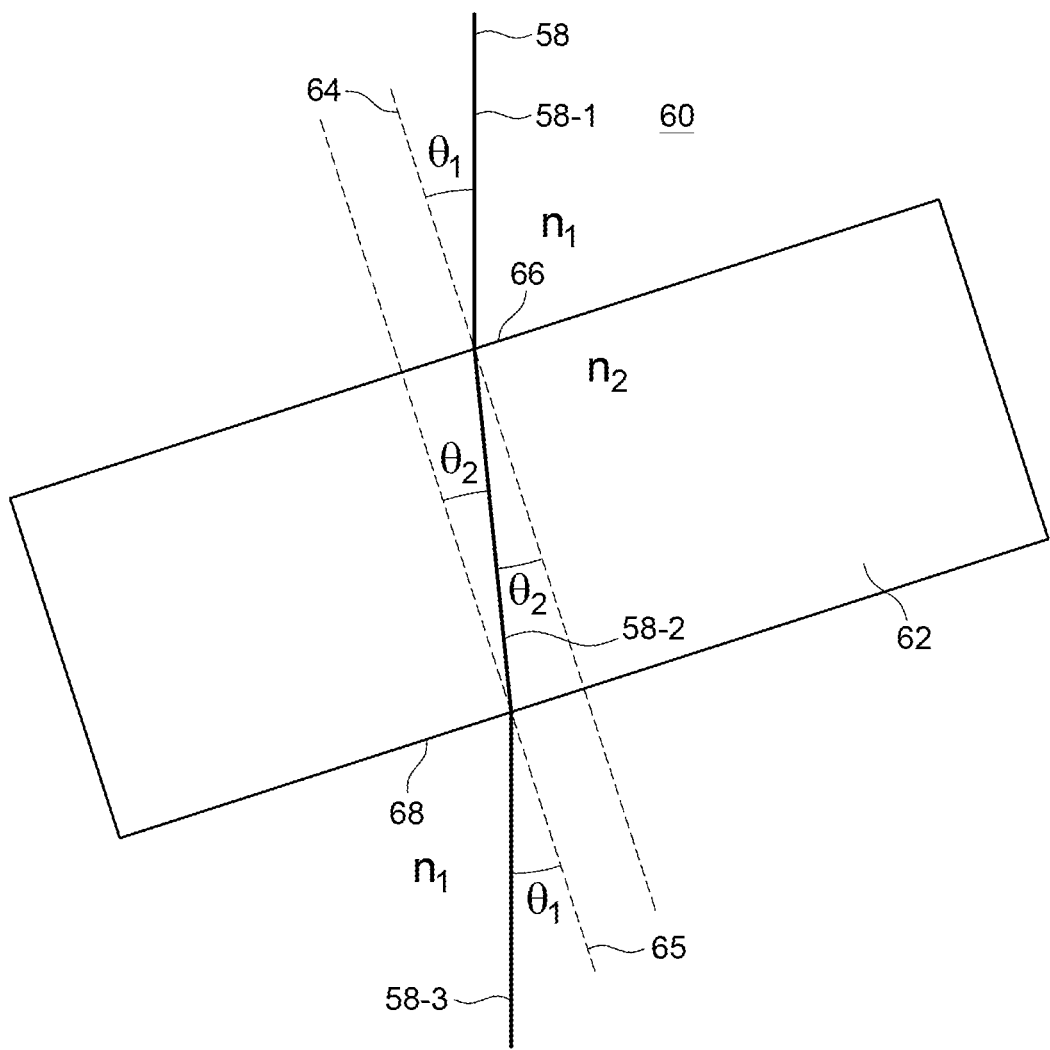
FIG. 3 schematically illustrate the principles of Snell's law applied in the present invention.

FIG. 3 schematically illustrates Snell's law which is applied in the present invention. Element 62 is a transparent block, for example made of glass. A beam 58 impinges on a receiving surface 66 of transparent block 62. The beam 58 leaves transparent block 62 at surface 68. Dotted line 64 indicates the normal (i.e. perpendicular) direction to the surface 66. The first section 58-1 of beam 58 travels through the ambient air which has an index of refraction $n_1$ of approximately 1.00. $\theta_1$ indicates the angle of section 58-1 of beam 58 relative to the normal 64 at surface 66. If the glass element 62 is made of fused silica it will have an index of refraction $n_2$ of approximately 1.46. Fused silica, also called fused quartz, is often used for fabricating optical elements such as lenses, and could be the material of choice for a transparent element in accordance with the present invention. Due to the higher index of refraction $n_2$ within the optical element 62, the beam 58 will refract in a direction which is closer to the normal 64 at the surface 66. Therefore, the angle between section 58-2 of the beam 58 and the normal 64, in FIG. 3 indicated by $\theta_2$ will be smaller than the original angle $\theta_1$ between the normal 64 and the section 58-1 of beam 58 in air, prior to entering the optical element 62. When leaving the optical element 62 at surface 58, the beam 58 will travel from a material having index of refraction $n_2$ to air which has again an index of refraction $n_1$ of approximately 1.00. Section 58-3 of beam 58 will refract into a direction having an angle $\theta_1$ to the normal indicated by dotted line 65 in FIG. 3. The direction of section 58-3 of beam 58 will be parallel but slightly displaced with respect to the direction of section 58-1. This principle can be used for scanning the beam 58 across a surface.

The relation between the angles $\theta_1$ and $\theta_2$ going from a material having a first index of refraction $n_1$ to a material having a second index of refraction $n_2$ has been indicated hereinabove. As will be appreciated, displacement of section 58-3 relative to section 58-1 will be maximized in case the angle $\theta_2$ between the normal 64 and section 58-2 of beam 58 will be as small as possible. Translating this to the relation indicated by equation 1 above, this means that ideally for achieving a large displacement, the index of refraction $n_2$ must be as large as possible relative to the index of refraction $n_1$. This may be achieved by a suitable choice of material for the optical element 62. As indicated above, we have used fused silica as the material of choice of the optical element 62, which has an index of refraction $n_2$ of approximately 1.46. However, theoretically in case the element 62 could be made of diamond, it would have an index of refraction of approximately 2.42 thereby causing the beam section 58-2 of beam 58 to be much closer to the normal 64 and maximizing the amount of displacement. Therefore, although not readily available in the desired size of the polygon prism, diamond would otherwise be a suitable choice. Generally, the material can be chosen such that it has a large index of refraction. At the same time, it must be realized that the material of choice should be transparent for the wavelength of the light of beam 58. Otherwise, the intensity of the beam 58 will reduce as a result of the optical element 62.

Another route to achieve larger displacement is to increase the distance between the 2 opposing facets. Although this has disadvantages (larger prism, longer optical distance, larger mass of prism) this has the advantage that the size of a facet relative to the size of the laser beam increases. Due to the finite (non-zero) size of the beam, the beam cannot be used during the transition from one facet to the next. In the short time period that the beam falls partly on one facet and partly on the next, there would be 2 spots on the substrate (50-1 and 50-4 in FIG. 2), so it may be switched off or blocked during this period. When the prism is larger, the percentage of time that the beam cannot be used for this reason will be reduced.

Figure 4A:
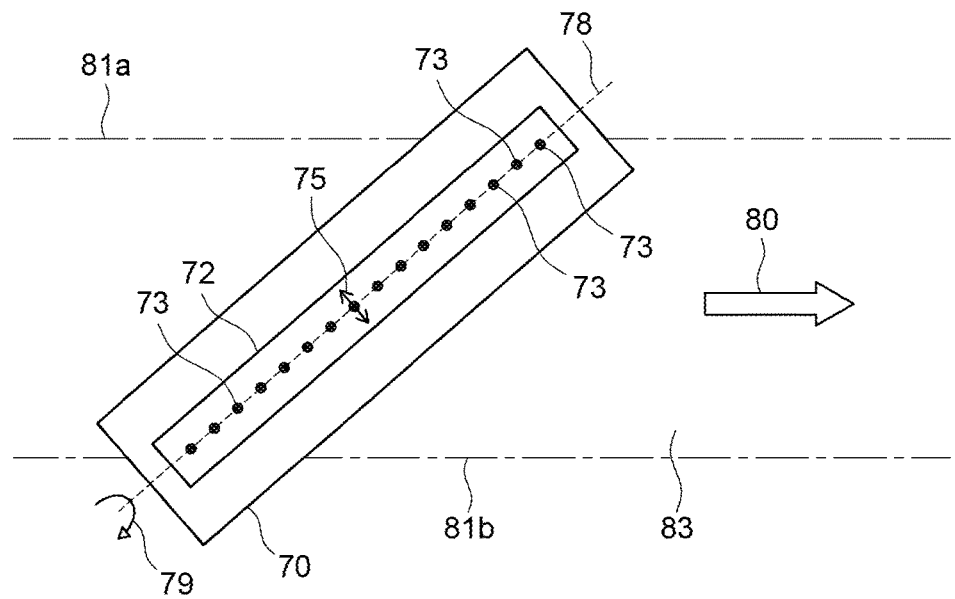
FIGS. 4A and 4B schematically illustrate an exposure head exposing a substrate in accordance with the present invention.
Figure 4B:
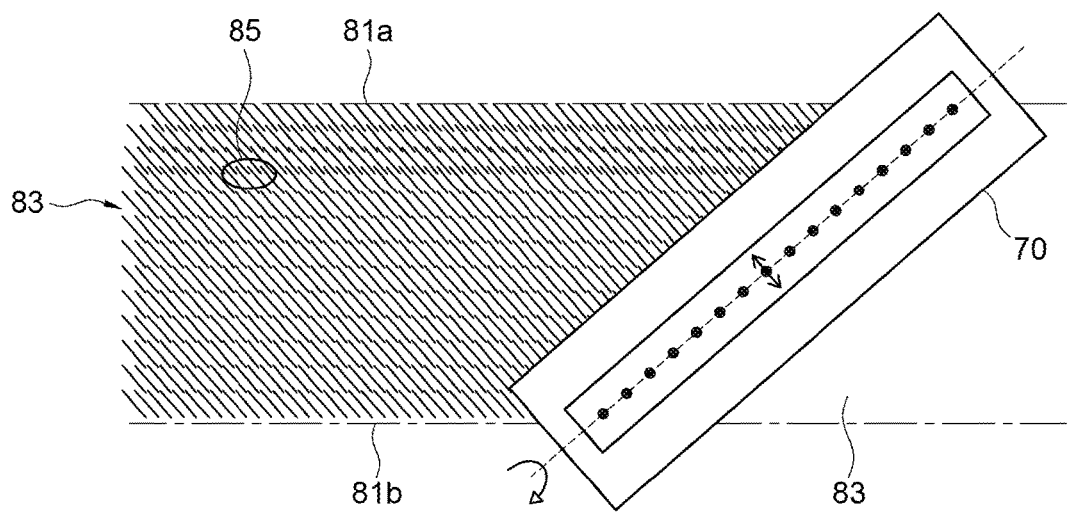

FIGS. 4A and 4B schematically illustrate an exposure head 70 in accordance with the present invention which is moved in the direction indicated by arrow 80 above the surface of the substrate 83. The exposure head 70 comprises a plurality of laser diodes 73 (only some of which have been indicated with that reference numeral 73 such as to not unnecessary complicate the FIG. 4A). The exposure head further comprises a rotatable polygon prism 72 of which the axis of rotation is schematically indicated by dotted line 78. The direction of rotation is indicated by arrow 79. Due to the rotation of polygon prism 72, the impingement spots that the light coming from laser diodes 73 will create on the surface of the substrate 83 will be scanned in the directions indicated by arrow 75. Dotted lines 81a and 81b schematically illustrate the borders of the area that can be illuminated using exposure head 70 while moving in the direction indicated by arrow 80 above the substrate 83. In FIG. 4B, the same exposure head 70 is illustrated in the position wherein it has moved in the direction indicated by arrow 80 above the substrate 83. As can be seen, behind the exposure head 70 the impingement spots of the laser diodes 73 of the exposure head have exposed the surface 83 across a multitude of line sections schematically indicated by reference numeral 85. The line sections 85 partly overlap at their end points as indicated in FIG. 4B. This overlapping may be performed intentionally, but it is also possible to perform illumination of the surface without overlapping of the line sections by switching the laser diodes 73 on and off in a controlled manner.

Figure 5:
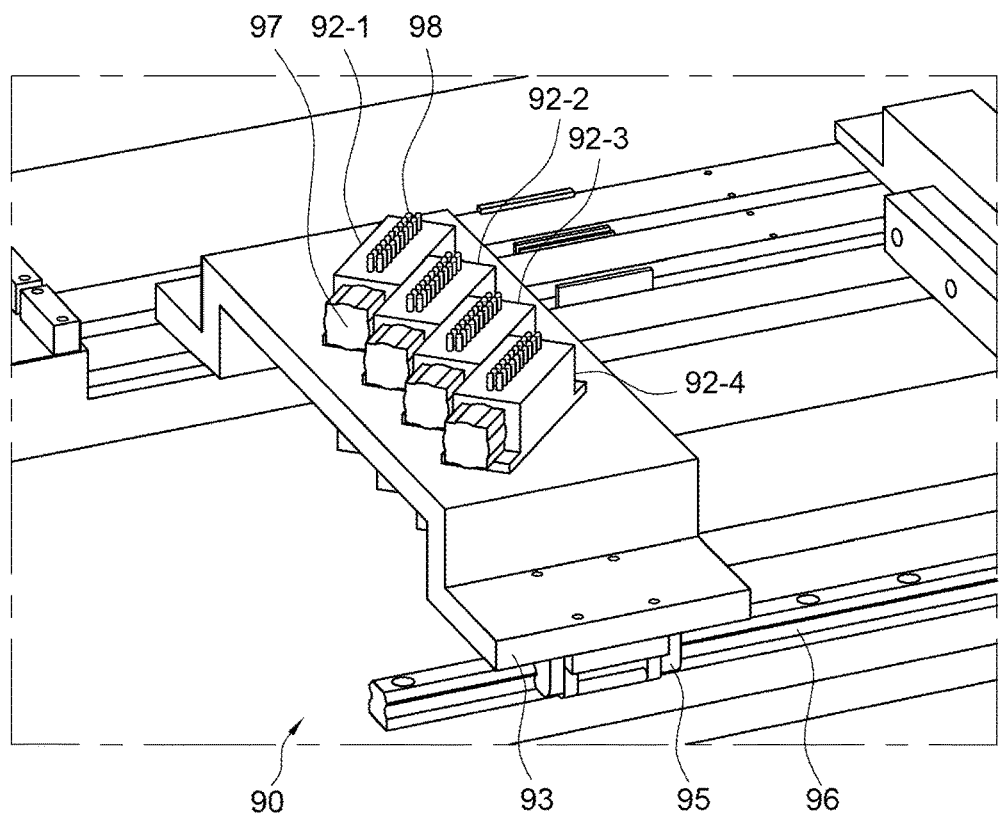
FIG. 5 illustrate an exposure apparatus comprising exposure heads in accordance with the present invention.

An exposure apparatus 90 in accordance with the present invention is schematically illustrated in FIG. 5. The exposure apparatus 90 comprises a carriage 93 which can be moved across a rail 96 using gliders 95 above a surface of a substrate. The exposure apparatus 90 comprises a plurality of exposure heads 92-1, 92-2, 92-3 and 92-4 in accordance with the present invention. Each of the exposure heads comprises a plurality of laser diodes 98 and a rotatable polygon prism 97.

Figure 6:
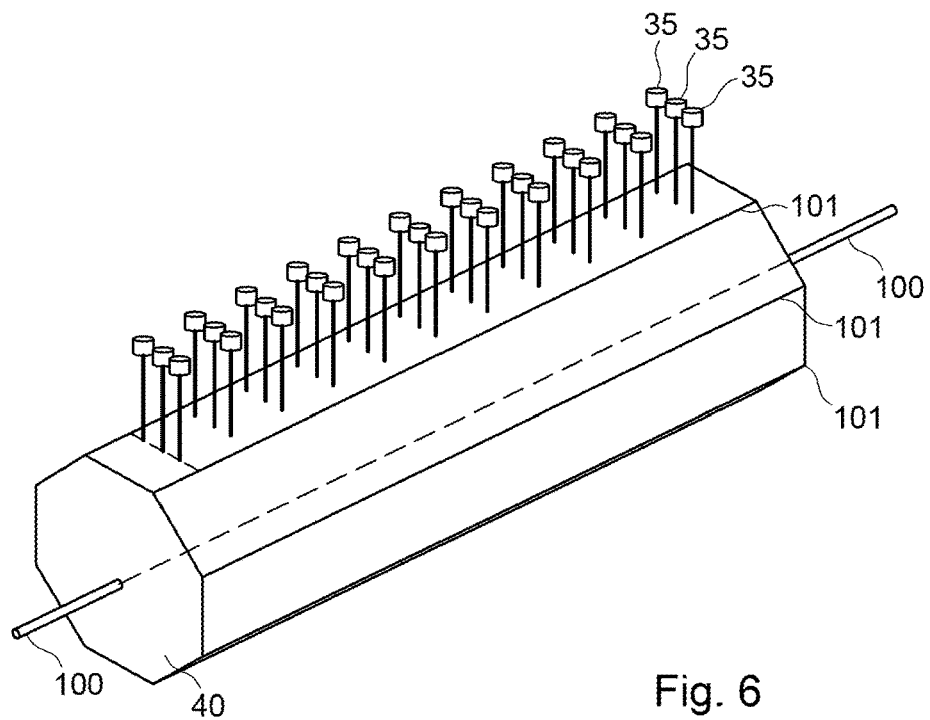
FIG. 6 illustrate a polygon prism and multiple rows of laser diodes applied in an exposure head in accordance with the present invention.

FIG. 6 schematically illustrates a polygon prism of octagonal form that may be used in an exposure head in accordance with the present invention. The octagonal polygon prism 40 may for example be the polygon prism illustrated in FIGS. 2A-2D above. The polygon prism 40 receives laser beams from a plurality of laser diodes 35 arranged above the prism 40. The laser diodes 35 can be operated in a controlled manner using a control system such as to allow exposure of a desired exposure pattern on the surface of a substrate. The polygon prism 40 can be rotated around an axis 100 for enabling scanning of light from the beams of laser diodes 35 on the substrate surface. In the arrangement illustrated in FIG. 6, the beams from laser diodes 35 impinge parallel to each other on the surface of polygon prism 40. Alternatively, the beams may be slightly tilted towards or away from each other as will be explained further below.

With the beams from lased diodes 35 impinging parallel on polygon prism 40, the beams will refract all with the same angle relative to the normal of the interface surface. On the substrate surface, this may cause the impingement spots of each of the beams of laser diodes 35 to describe a line section parallel to the line sections illuminated by other laser diodes. For the three laser diodes in each row of the matrix of laser diodes indicated in FIG. 6, the line sections described by the impingement spots will be parallel and within each others extension. This is because the laser diodes 35 of a single row of the matrix illustrated in FIG. 6 are positioned in a straight line which is perpendicular to the axis of rotation 100 of the polygon prism 40.

Figure 7A:
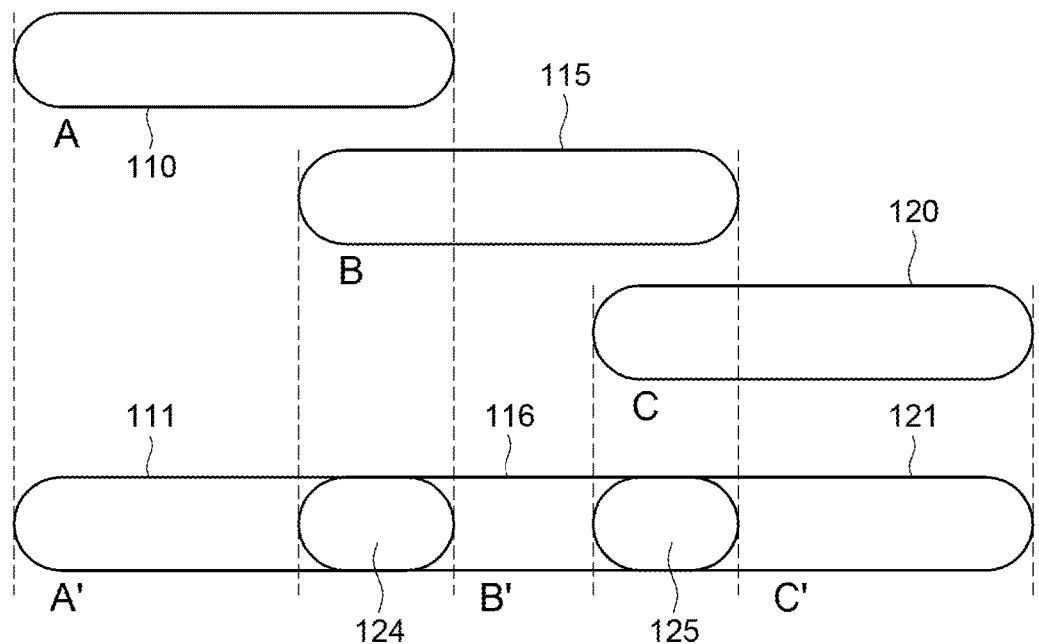
FIGS. 7A and 7B schematically illustrate an operation scheme of laser diodes in an exposure head in accordance with the present invention.
Figure 7B:
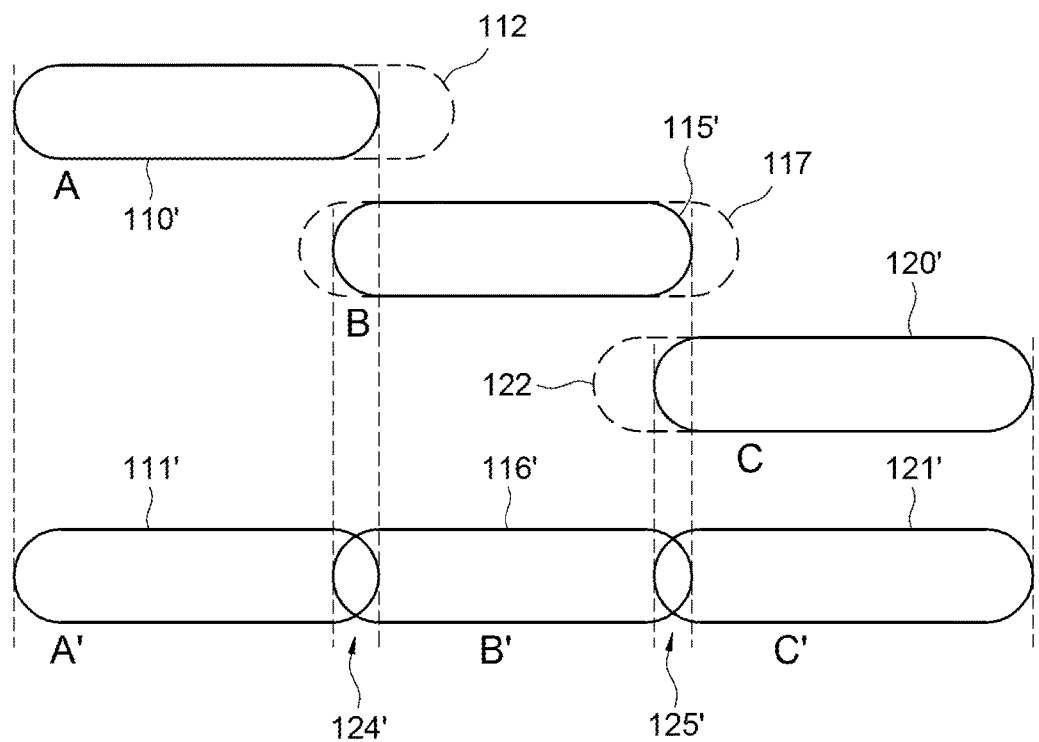

An illumination pattern that may be obtained by the laser diodes 35 of a single row of the matrix of laser diodes illustrated in FIG. 6, is illustrated in FIGS. 7A and 7B. In FIG. 7A, the line sections described by the impingement spots of the beams from the laser diodes A, B and C in a single row, are indicated by reference numerals 111, 116 and 121 (also A', B' and C' in FIG. 7A). The line sections 111, 116 and 121 forming the illumination pattern of these laser diodes are parallel to each other, and within each others extension, such that they form a straight line. The individual line sections described by each of the laser diodes A, B and C is illustrated in FIG. 7A in line sections 110, 115 and 120. The most left laser diode A in the row, which provides the illumination pattern 110 individually, may be operated across its full length as indicated in line section 110 between the dotted lines. If the full duration of powering of the laser diodes is performed for all the laser diodes A, B and C, this will result in the line sections 111, 116 and 121 to overlap in areas 124 and 125. As will be appreciated, assuming that the intensities of the beams provided by the laser diodes will be equal, this would result in the areas 124 and 125 receiving a double exposure dose of the optical radiation provided by the laser diodes. This may not be desired, and therefore the control system may modify the duration for which each of the laser diodes 35 A, B and C, is operated, in such a manner that the material of the substrate which is illuminated receives an equal dose everywhere.

This modification of the duration of operation of the laser diodes is illustrated in FIG. 7B schematically. In FIG. 7B, for laser diode A, the line section 112 which corresponds to the maximum achievable duration of operation of the laser diode is illustrated by the dotted line. However, the control system operates laser diode A for a shorter duration as schematically indicated by line section 110'. For laser diode B, the control system shortens the duration of operation of the laser diode at both ultimate ends of the potentially achievable illumination 117. This results in the shorter line section 115' to be delivered to the substrate material. Likewise, laser diode C will provide an illuminated line section 120' which is shorter than the maximum achievable line section 122 for this laser diode. Super imposed on top of each other on the substrate surface, this will provide the illumination pattern illustrated by line sections 111', 116' and 121'. In the overlap areas 124' and 125', operation of the laser diodes is controlled such that the substrate surface receives more or less the same amount of optical energy as in other parts of the line sections 111', 116' and 121'.

As already suggested above, instead of the beams from laser diodes 35 in FIG. 6 impinging on the surface of polygon prism 40 parallel to each other, the beams may alternatively be slightly tilted towards or away from each other. The tilting the beams mutually may be very small (e.g. <1°, or even <0.5°, or alternatively even a fraction of 0.5°). In addition to, or instead of, the above controlled operation of the diodes, the slight deliberate tilting may establish, increase or decrease a certain amount of overlap of the exposure area's. The amount of mutual tilting desired in such an embodiment will of course be dependent on a number of properties of the system. For example, the length of the optical path of the beam from the light source to the substrate surface will determine the amount of offset of a beam compared to the situation without the tilting.

In some embodiments, the position of the transparent polygon may be determined with the motor pulse of the driving motor for rotating the prism. Turning back to FIG. 6, to obtain a more accurate determination of the position, in accordance with some embodiments, the edges 101 between the facets of the transparent polygon prism in the exposure head of the present invention are coated with a reflective coating. This may for example be a reflective or specular reflective coating, e.g. a metal coating. Reflection of a beam at the edges of the polygon prism may in these embodiments be detected using an additional PIN diode type photodetector or charge-coupled device (or another suitable type photodetector) included in the exposure head or exposure apparatus of the invention.

The position can be determined accurately by measuring the reflection of the UV laser diodes. As each laser diode passes eight facets, the measurement of the polygon prism position would at least be eight times more accurate in comparison to measuring the position based on the motor pulse. Also note that photodiodes can have temporal resolution below 10 nanoseconds, for example some photodiodes have a response time even down to 2.5 nanoseconds. The passing of the edges 101 of the polygon prism past each laser diode beam are thus determinable very well.

Measuring the reflected light further makes it easier to detect broken UV laser diodes in operation. In addition, it is even possible to determine whether the UV laser diodes are still in focus. Although one could also measure the angular variation of the reflected light without using a reflected coating on the edges, the advantage of a coating is that it gives a more pronounced amplitude variation and minimizes the transmission of light.

Figure 8A:
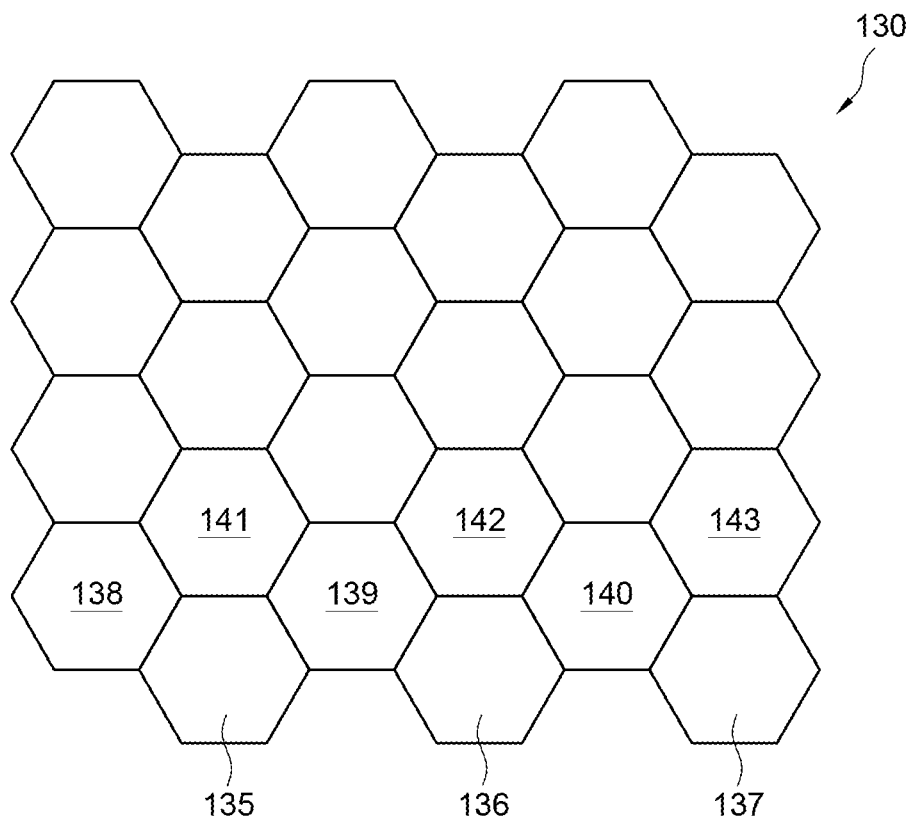
FIG. 8A illustrates an arrangement of laser diode in an exposure head in accordance with the present invention.

As will be appreciated the laser diodes may be placed in a matrix configuration, for example as indicated in FIG. 6. The laser diodes could be arranged in rows and columns, wherein the laser diodes within each row and each column could be arranged parallel to each other. Although this provides a regular arrangement of the laser diodes in two directions, this does not achieve the most densely possible arrangement of laser diodes available. Therefore, other arrangements of laser diodes may be applied, and one of these other arrangements is schematically indicated in FIG. 8A. In FIG. 8A, each of the hexagonal surfaces schematically illustrates an output surface or output face of a laser diode. The term 'output face' is to be understood here as the (notional) space that belongs to, or is reserved for, the output beam of the laser diode. It is thus not required that the laser diodes are themselves actually shaped having hexagonal light emitting surfaces, although this may of course be an embodiment. The laser diodes may comprise light emitting surfaces of any desired shape, e.g. round, oval, square, rectangular, triangular, pentagonal, hexagonal, heptagonal, octagonal, or otherwise polygonal. The laser diodes are in FIG. 8A arranged in a honeycomb arrangement. A honeycomb arrangement as illustrated in FIG. 8A is an arrangement of equilateral or at least isosceles triangles, wherein the laser diodes (or light sources) are positioned on the corners of the triangles. The honeycomb arrangement 130 illustrated in FIG. 8A enables a more dense arrangement of laser diodes.

Figure 8B:
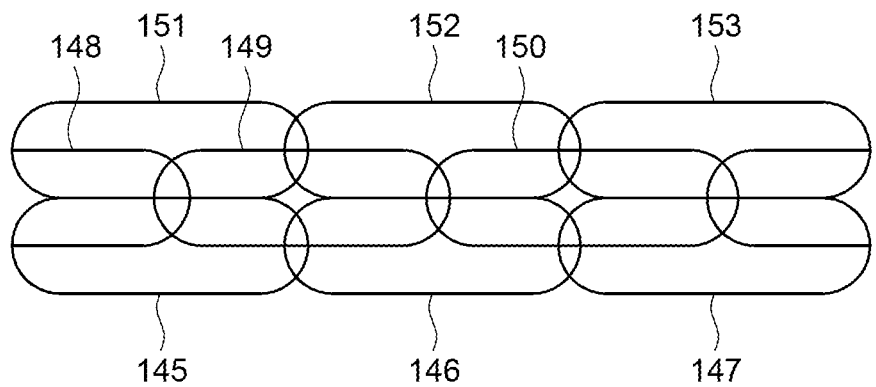
FIG. 8B schematically illustrate part of an exposure pattern obtained using the arrangement of FIG. 8A.

To illustrate a possible illumination pattern by the laser diodes of FIG. 8A, some of the laser diodes have been indicated with a reference numeral. Reference numerals 135-143 each refer to an individual laser diode in three consecutive rows of laser diodes in the arrangement 130. Their controlled illumination patterns are illustrated in FIG. 8B. Line section 145 corresponds with the illumination pattern of laser diode 135. Likewise, line section 146 corresponds to laser diode 136, line section 147 to laser diode 137, line section 148 corresponds to laser diode 138, etcetera, and the last line section 153 of FIG. 8B corresponds to the lines coming from laser diode 143 in FIG. 8A.

As can be seen in FIG. 8B, the exposed line sections of two consecutive rows (e.g. a first row 135-137 and a second row 138-140) partly overlap. The same amount of overlap will be obtained by each two consecutive rows of laser diodes. The arrangement of laser diodes in honeycomb arrangement 130 and their illumination pattern indicated in FIG. 8B is such that almost every part of the surface receives light from at least two laser diodes.

The intensity of light coming from each of the laser diodes 135-143 has been chosen such that the dose received from each of the laser diodes is at least half the dose but not the full dose required for the exposure of the substrate. For example, the full dose to be received by the surface could be the dose that is required to perform a certain chemical process on the substrate surface. Therefore, to be fully exposed, each part of the surface requires to receive light from at least two laser diodes. By modulating the intensity of the light beams of each of the laser diodes by a control system, this allows to position a desired exposure pattern on the substrate surface at a higher resolution than as determined by the width of each of the line sections. The effective resolution obtainable for positioning the exposure pattern is defined by the width of the overlap areas of the line sections.

Many different arrangements of adjacent laser diodes may be applied in the exposure head of the present invention. For example, in a further embodiment two or more adjacent laser beams are arranged adjacent each other in a direction of motion of the exposure head relative to the substrate surface. In this embodiment, upon passing of a facet of the transmissive element or polygon prism, the adjacent lased diodes illuminate the substrate by illuminating a pattern in a same path in the direction of motion. The patterns created with subsequent passing of the facets of the transmissive element can be made to be contiguous to each other, or even partially overlapping. In the latter case, where the patterns are partially overlapping, placement of the illuminated image on the substrate surface can done at an accuracy below the resolution of the optical system. To control the mutual distance between simultaneously described illumination patterns of two (or more) adjacent laser diodes during a same passing of a facet of the transmissive element, the direction of the laser beams provided by each diode may be slightly adapted e.g. in combination with the length of the optical path towards the substrate surface. To control the mutual distance between subsequently described illumination patterns of two (or more) adjacent laser diodes during subsequent passing of one or more facets of the transmissive element in time, the velocity of movement of the transmissive element may be adapted. A motion driver of an exposure apparatus wherein the exposure head is applied may for example be arranged for adapting the motion velocity of the exposure head such that in time subsequent illumination patterns of said two or more adjacent laser diodes at least partially overlap. In combination herewith, the timing of switching the laser diodes on and off may be controlled suitably.

Further to the above, in a further embodiment two or more adjacent laser diodes are arranged under an angle with the direction of movement of the transmissive element and/or the notional axis of rotation of the transmissive element. The angle may be selected such the illumination patterns of the such adjacently arranged laser diodes form parallel paths or lanes in the direction of motion of the transmissive element. These paths or lanes may be partially overlapping.

Other arrangements of laser diodes or orientations thereof may be applied as well dependent on the desired implementation requirements, within the scope of the present claims, and without departing from the inventive concept as described herein. Moreover, also the direction of motion of the transmissive element, and the orientation of its rotation axis may be suitably selected relative to each other as well.

As is clear from the above, the simplified optical arrangement of the exposure head of the present invention, the absence of a large part of the optics and the shortening of the optical path as well as the absence of oblique beam landings, allow for many additional advantages obtainable by smart and suitable positioning of the laser diodes and their orientation with respect to the transmissive element. Some of these advantages have been described in the description hereinabove.

Although hereinabove, most embodiments have been described using laser diodes as light sources to provide a beam to be scanned across the substrate surface, the invention may be applied using different types of light sources. For example, a laser beam may be provided using a YAG-laser or glass laser (e.g. an erbium glass laser) or other type of laser device. Alternatively, beams from other types of light sources may be made to be scanned using an exposure head of the present invention. Generally, to prevent chromatic aberration, light sources providing light within a small wavelength band are preferred (e.g. monochromatic sources such as the laser light sources mentioned above). However, with the use of some additional optics to account for chromatic aberration, or in applications wherein inaccuracy caused by chromatic aberration is considered acceptable, the exposure head may be applied using other light sources such as broadband light sources as well. For example in those cases, the invention may be applied using incandescent lamps or discharge lamps. Further to the above, the light may be conveyed to the transmissive element (or transparent element or polygon prism) using any suitable means, including an optical system or optical fibers.

The exposure head of the present invention may be applied widely in a plurality of different types of exposure apparatuses. Without being bound by any of the suggested types of apparatuses described herein, one or more exposure heads in accordance with embodiments of the present invention may for example be applied for establishing an exposure apparatus to be used within a specific manufacturing process. Such an exposure apparatus may for example be being any one or more of a group comprising: a printed circuit board (PCB) manufacturing system wherein one or more exposure heads according to the invention are used for selectively irradiating radiation sensitive layers; a stereolithography system wherein one or more exposure heads according to the invention are used for selectively irradiating sequential layers of radiation sensitive liquid material to form a tangible object; and a powder bed fusion system wherein one or more exposure heads according to the invention are used for selectively irradiating and thereby melting and/or sintering of sequential layers of solid powder material to form a tangible object. Any of such apparatuses may for example be arranged for illuminating each surface area of a substrate surface two or more times sequentially by sets of two or more of said radiative sources.

In the above, there is mentioned an embodiment of a printed circuit board (PCB) manufacturing system. In general an apparatus may be foreseen wherein a manufacturing process is based on irradiation of a photo resist for creation of a mask. The local irradiation of the resist may change the chemical properties of the photosensitive resist locally, after which an etch process can be applied for manufacturing of e.g. the PCB. As will be appreciated, instead of a PCB this process can be used for other purposes such as manufacturing of a thin film transistor (TFT) array, metal grids for solar panels or OLED's or displays, metal antennas for e.g. RFID, etcetera. In general, the exposure head may be used for two dimensional and/or three dimensional manufacturing processes. Two dimensional processes may include surface modification, repairs, etc. Three dimensional processes may include added manufacturing or stereolithography.

Moreover, the present invention is not limited to an exposure head comprising radiative sources of any particular type. Although laser diodes have been described as a preferred embodiment, other types of light sources may also be applied. Neither is the exposure head limited to use of radiative sources that provide light in the visible spectrum. The light or radiation provided by the radiative sources may be of a same or of different wavelengths. A particular embodiment for example irradiates each surface area of said substrate surface two or more times sequentially by sets of two or more of said radiative sources, wherein said radiative sources comprise radiative sources of different wavelength. Moreover, radiation provided by the radiation sources may be monochromatic or multichromatic—e.g. provide radiation in a accordance with a spectral profile.

The present invention has been described in terms of some specific embodiments thereof. It will be appreciated that the embodiments shown in the drawings and described herein are intended for illustrated purposes only and are not by any manner or means intended to be restrictive on the invention. The context of the invention discussed here is merely restricted by the scope of the appended claims.

The invention claimed is:

1. An exposure head for use in an exposure apparatus for illuminating a surface, the exposure head comprising:
   a plurality of radiative sources for providing a plurality of beams,
   an optical scanning unit arranged for receiving the beams and for directing the beams towards the surface for impinging each of the beams on an impingement spot, and
   a rotation actuating unit connected to the optical scanning unit for at least partially rotating the optical scanning unit,
   wherein the impingement spots of the beams are scanned across the surface by said at least partial rotation of the optical scanning unit, wherein the optical scanning unit comprises a transmissive element, wherein the transmissive element is a polygon prism, the transmissive element including one or more facets for receiving the beams and for outputting the beams after conveying thereof through the transmissive element, for displacing the beams upon said rotation of the transmissive element for enabling the scanning of the impingement spots, the impingement spots thereby illuminating the surface in a pattern for forming an image.

2. The exposure head according to claim 1, wherein the facets of the polygon prism are even in number, wherein each two facets on opposing sides of the polygon prism cooperate such that in use a first one of said opposing facets receives at least one of said beams and a second one of said opposing facets outputs said received at least one beam.

3. The exposure head according to claim 2, wherein the opposing facets are parallel so that the at least one beam is output under a same angle as an angle of incidence of the at least one beam on the receiving first one of said opposing facets.

4. The exposure head according to claim 1, wherein the plurality of radiative sources include a plurality of laser diodes.

5. The exposure head according to claim 1, wherein two or more of said plurality of radiative sources are arranged adjacent each other in a direction perpendicular to the notional rotation axis of the at least partial rotation of the transmissive element by the rotation actuating unit, and wherein said two or more of said adjacently arranged plurality of radiative sources include two or more of a plurality of diodes arranged adjacently.

6. The exposure head according to claim 5, wherein the laser beams of the two or more of said plurality of laser diodes arranged adjacently are directed at substantially a same impingement location on the transmissive element.

7. The exposure head according to claim 5, wherein the two or more adjacently arranged laser diodes are placed to enable scanning of the laser beams across scan lines that are aligned with each other, and wherein at least one of the placement of the adjacent laser diodes or the size of at least one of the facets of the transmissive element is such that the scan lines of the adjacent laser beams at least partly overlap.

8. The exposure head according to claim 5, wherein the two or more adjacently arranged laser diodes are arranged to enable scanning of the laser diodes across scan lines that are parallel but not aligned with each other, and wherein at least one of the arrangement of the laser diodes or the size of at least one of the facets of the transmissive element is such that the scan lines of the adjacent laser beams at least partly overlap, for enabling exposure of an image at sub-pixel accuracy by means of intensity manipulation of light from the laser diodes.

9. The exposure head according to claim 5, wherein a further two or more of said plurality of laser diodes are arranged adjacent each other in a direction parallel with a notional rotation axis of the at least partial rotation of the transmissive element by the rotation actuating unit.

10. The exposure head according to claim 5, wherein in use the exposure head is moved relative to the illuminated surface in a motion direction, the illuminated surface being a substrate surface, wherein two or more of said plurality of laser diodes are arranged adjacent each other in the motion direction to enable illumination of the surface simultaneously in a same path in said motion direction.

11. The exposure head according to claim 5, wherein in use the exposure head is moved relative to the illuminated surface in a motion direction, the illuminated surface being a substrate surface, wherein two or more of said plurality of laser diodes are arranged adjacent each other under an angle with the motion direction, to illuminate the substrate surface simultaneously in overlapping or parallel paths in said motion direction.

12. The exposure head according to claim 1, wherein the transmissive element, at one or more edges between said facets, comprises a reflective coating.

13. The exposure apparatus of claim 1 comprising at least one exposure head according to claim 1, the exposure apparatus further comprising:
a motion driver for moving the at least one exposure head and a substrate surface relative to each other to describe an exposure trajectory across the substrate surface for exposing the substrate surface, and
an image controller arranged for providing an electric signal to the at least one exposure head dependent on exposure image data, for enabling control of the laser diodes of the at least one exposure head.

14. The exposure apparatus according to claim 13, wherein the at least one exposure head is an exposure head comprising:
a plurality of radiative sources for providing a plurality of beams,
an optical scanning unit arranged for receiving the beams and for directing the beams towards the surface for impinging each of the beams on an impingement spot, and
a rotation actuating unit connected to the optical scanning unit for at least partially rotating the optical scanning unit,
wherein the impingement spots of the beams are scanned across the surface by said at least partial rotation of the optical scanning unit, wherein the optical scanning unit comprises a transmissive element including one or more facets for receiving the beams and for outputting the beams after conveying thereof through the transmissive element, for displacing the beams upon said rotation of the transmissive element, and for enabling the scanning of the impingement spots, the impingement spots thereby illuminating the surface in a pattern for forming an image, wherein the one or more radiative sources include one or more laser diodes and wherein in use the exposure head is moved relative to the illuminated surface in a motion direction, the illuminated surface being a substrate surface, wherein two or more of said plurality of laser diodes are arranged adjacent each other in the motion direction to enable illumination of the surface simultaneously in a same path in said motion direction, and wherein the motion driver is arranged for adapting the motion velocity of the exposure head such that in time subsequent illumination patterns of said two or more adjacent laser diodes at least partially overlap.

15. The exposure apparatus according to claim 13, wherein one or more of said at least one exposure head comprises at least two laser diodes, which are arranged adjacent each other in a direction perpendicular to a notional rotation axis of the at least partial rotation of the transmissive element by the rotation actuating unit of said exposure head, wherein the at least two adjacently arranged laser diodes are placed to enable scanning of the laser beams across scan lines that are aligned with each other, and wherein at least one of the placement of the adjacent laser diodes or the size of at least one of the facets of the transmissive element of the exposure head is such that the scan lines of the adjacent laser beams at least partly overlap, wherein at least one of the image controller of the apparatus or an exposure control unit of the exposure head is arranged for timing operation of the laser diodes dependent on the exposure image data.

16. The exposure apparatus according to claim 13, said exposure apparatus further comprising:
a printed circuit board—PCB—manufacturing system wherein one or more of the at least one exposure head comprising:
a plurality of radiative sources for providing a plurality of beams,
an optical scanning unit arranged for receiving the beams and for directing the beams towards the surface for impinging each of the beams on an impingement spot, and
a rotation actuating unit connected to the optical scanning unit for at least partially rotating the optical scanning unit,
wherein the impingement spots of the beams are scanned across the surface by said at least partial rotation of the optical scanning unit, wherein the optical scanning unit comprises a transmissive element including one or more facets for receiving the beams and for outputting the beams after conveying thereof through the transmissive element, for displacing the beams upon said rotation of the transmissive element, and for enabling the scanning of the impingement spots, the impingement spots thereby illuminating the surface in a pattern for forming an image, is used for selectively irradiating radiation sensitive layers.

17. The exposure apparatus according to claim 13, wherein the apparatus is arranged for illuminating each surface area of said substrate surface two or more times sequentially by sets of two or more of said radiative sources.

18. The exposure apparatus according to claim 13, wherein said radiative sources comprise radiative sources of different wavelength.

19. The exposure apparatus according to claim 13, said exposure apparatus further comprising:
  a stereolithography system wherein one or more of the at least one exposure head comprising:
    a plurality of radiative sources for providing a plurality of beams,
    an optical scanning unit arranged for receiving the beams and for directing the beams towards the surface for impinging each of the beams on an impingement spot, and
    a rotation actuating unit connected to the optical scanning unit for at least partially rotating the optical scanning unit,
  wherein the impingement spots of the beams are scanned across the surface by said at least partial rotation of the optical scanning unit, wherein the optical scanning unit comprises a transmissive element including one or more facets for receiving the beams and for outputting the beams after conveying thereof through the transmissive element, for displacing the beams upon said rotation of the transmissive element, and for enabling the scanning of the impingement spots, the impingement spots thereby illuminating the surface in a pattern for forming an image, is used for selectively irradiating sequential layers of radiation sensitive liquid material to form a tangible object.

20. The exposure apparatus according to claim 13, said exposure apparatus further comprising:
  a powder bed fusion system wherein one or more of the at least one exposure head comprising:
    a plurality of radiative sources for providing a plurality of beams,
    an optical scanning unit arranged for receiving the beams and for directing the beams towards the surface for impinging each of the beams on an impingement spot, and
    a rotation actuating unit connected to the optical scanning unit for at least partially rotating the optical scanning unit,
  wherein the impingement spots of the beams are scanned across the surface by said at least partial rotation of the optical scanning unit, wherein the optical scanning unit comprises a transmissive element including one or more facets for receiving the beams and for outputting the beams after conveying thereof through the transmissive element, for displacing the beams upon said rotation of the transmissive element, and for enabling the scanning of the impingement spots, the impingement spots thereby illuminating the surface in a pattern for forming an image, is used for selectively irradiating and thereby melting and/or sintering of sequential layers of solid powder material to form a tangible object.

* * * * *